(12) United States Patent
Baftiri

(10) Patent No.: US 11,127,670 B2
(45) Date of Patent: Sep. 21, 2021

(54) COMPONENT CARRIER WITH STABILIZING STRUCTURE FOR INTERFACE ADHESION

(71) Applicant: AT&S (China) Co. Ltd., Shanghai (CN)

(72) Inventor: Artan Baftiri, Trento (IT)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 16/739,826

(22) Filed: Jan. 10, 2020

(65) Prior Publication Data

US 2020/0243436 A1    Jul. 30, 2020

(30) Foreign Application Priority Data

Jan. 28, 2019 (CN) .......................... 201920148310.6

(51) Int. Cl.
*H01L 23/498* (2006.01)

(52) U.S. Cl.
CPC .. *H01L 23/49872* (2013.01); *H01L 23/49877* (2013.01); *H01L 23/49894* (2013.01)

(58) Field of Classification Search
CPC ................................................ H01L 23/49872

USPC ......................................................... 257/690
See application file for complete search history.

(56) References Cited

U.S. PATENT DOCUMENTS

| 2013/0048361 A1* | 2/2013 | Yamashita | ........ H01L 23/49822 174/260 |
| 2015/0107880 A1* | 4/2015 | Kim | ...................... H05K 1/185 174/255 |
| 2015/0145145 A1* | 5/2015 | Tsuyutani | ............. H01L 21/561 257/774 |
| 2017/0094797 A1* | 3/2017 | Baek | ...................... H05K 1/185 |

FOREIGN PATENT DOCUMENTS

CN         209643071 U  * 11/2019  ........... H05K 1/0373

* cited by examiner

*Primary Examiner* — Ajay Arora
(74) *Attorney, Agent, or Firm* — Robert A. Blaha; Smith Tempel Blaha LLC

(57) ABSTRACT

A component carrier includes a stack with at least one electrically insulating layer structure and/or at least one electrically conductive layer structure, a component which is embedded in the stack and a stabilizing structure arranged between a stack surface of the stack and a main surface of the component. The stabilizing structure provides an interface adhesion to the main surface of the component.

15 Claims, 1 Drawing Sheet

COMPONENT CARRIER WITH STABILIZING STRUCTURE FOR INTERFACE ADHESION

CROSS-REFERENCE TO RELATED APPLICATION

This application claims the benefit of the filing date of the Chinese utility model ZL201920148310.6 filed Jan. 28, 2019, the disclosure of which is hereby incorporated herein by reference.

TECHNICAL FIELD

Embodiments of the invention generally relate to the field of semiconductor devices, and particularly to a component carrier with a stabilizing structure.

TECHNOLOGICAL BACKGROUND

Component carriers comprising one or a plurality of components comprise a stack of the plurality of layers, wherein at least one component is embedded therein. The interface adhesion forces between the component and the stack are limited compared to covalent bonding and as well as compared to adhesion level of treated surfaces with adhesion promoters. Hence, with smaller space requirements of the component and the respective component carriers, the risk of delamination between the component and the stack layers increases.

SUMMARY

Hence, there may be a need to provide a robust component carrier with a reduced risk of delamination.

A first embodiment of a component carrier, includes a stack with at least one electrically insulating layer structure and/or at least one electrically conductive layer structure. The component carrier further includes a component which is embedded in the stack. Furthermore, the component carrier further includes a stabilizing structure which is arranged between a stack surface of the stack (e.g. an outer surface of the stack) and a main surface of the component. The stabilizing structure is configured for providing an interface adhesion to the main surface of the component.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

The component is in particular an electric component having electrical connections to other components within the stack or to other functional elements within or outside the stack. The component may have two opposing main surfaces to which electrical connections for transmitting signals or power to and away of the component can be coupled. The main surfaces are connected by the lateral side surfaces of the stack. Between main surface and the respective side surface, an edge is formed. The edge may be sharp and may cause delamination from the stack material.

The stabilizing structure is arranged within the stack and in particular between the stack surface of the stack and the main surface of the component. The stabilizing structure provides an interface adhesion to the main surface of the component in order to reduce the risk of delamination. In particular, the stabilizing structure is chosen of a material which may comprise a stronger adhesion to the component in comparison to the stack and the several stacked layers, respectively. In particular, the stabilizing structure is made of material which has the highest stress absorption and the highest interface/interface adhesion to a metallic area of the component. Hence, according to the present component carrier a more robust component carrier is provided due to the reduction of the risk of delamination by the stabilizing structure.

According to an exemplary embodiment of the component carrier, the main surface of the component comprises a metallic area. The metallic area of the component may for example be a casing or an electrical contact of the component. However, the material of the stack may be for example ceramic or a polymer (such as prepreg, resin coated copper foils or resin sheets) which has a low adhesion characteristic to the metallic area of the component. However, in the region of the metallic area of the component, the stabilizing structure is formed, such that an increased adhesion between the stabilizing structure and the metallic area can be provided so that the risk of delamination is reduced.

According to a further exemplary embodiment of the component carrier, the stack comprises at least one opening between the stack surface and the main surface of the component filled with the stabilizing structure. The opening may be made by drilling, laser processing, plasma processing or etching processing. Furthermore, a plurality of openings may be formed within the stack, so that a plurality of stabilizing structure elements (such as pillars) may be arranged within the respective openings. After forming the opening, the stabilizing structure may be filled in the opening in a liquid state and may be hardened in a subsequent step.

According to a further exemplary embodiment of the component carrier, the stabilizing structure comprises at least one of copper material, silver paste material and tin paste material.

According to a further exemplary embodiment of the component carrier, the component carrier further comprises at least one via which is formed within the stack. The via is coupled to the component and provides an electrical connection to the component, wherein the material of the via may differ from the material of the stabilizing structure. The via transfers signals or power to or away from the component. Additionally, the stabilizing structure may be attached to the vias. Hence, the vias can be designed without having a high lamination characteristic because the task can be fulfilled by the additional stabilizing structure. Hence, the material of the vias differs from the material of the stabilizing structure.

According to a further exemplary embodiment of the component carrier, the component comprises the above-mentioned side surface and an edge between the main surface and the side surface.

According to a further exemplary embodiment of the component carrier, the side surface is free of an interface adhesion with the stabilizing structure. Hence, the stabilizing structure is only in contact with both or one of the main surfaces of the component.

According to a further exemplary embodiment of the component carrier, the stabilizing structure provides an interface adhesion to the main surface of the component and to the side surface of the component. Hence, in other words, the stabilizing structure extends along the main surface and additionally along the side surface. Thereby, the stabilizing structure envelopes the edge of the component. Hence, the sharp edges of the component are covered by the stabilizing structure, so that the risk of delamination in the edge area is reduced.

According to a further exemplary embodiment of the component carrier, the component comprises a further main surface being arranged opposed to the main surface, wherein the stabilizing structure provides an interface adhesion to the main surface, the further main surface and the side surface of the component. Hence, the stabilizing structure partially envelopes the component for increasing the lamination properties.

According to a further exemplary embodiment of the component carrier the stabilizing structure extends along the side surface of the component, the stabilizing structure comprises at the edge of the component a larger thickness than at a central area of the side surface being spaced apart from the edge. Hence, at the edges of the component, a high mechanical strength due to the thicker stabilizing structure at the edge section can be provided.

According to a further exemplary embodiment of the component carrier, the stabilizing structure forms a stabilizing pillar. The pillar may be made of a cylindrical shape having a circular, elliptical or rectangular base area. The pillar forms an extension between the main surface of the component and the surface (outer surface) of the stack.

According to a further exemplary embodiment, the stabilizing pillar comprises a wedge shape having a larger thickness in a section at the stack surface than at the main surface. Hence, a proper mechanical strength can be provided.

According to the present component carrier, a more robust component carrier is provided. Due to the materials of the component and the stack, the risk of delamination exists. Furthermore, as the component geometry is typically as regular as possible, sharp edges and flat surfaces exist. Hence, the risk of delamination in these areas exists. By the present component carrier, laminar stress flow over an interface polymer (of the stack) to metal (of the component) or polymer to ceramic, which may be the embedding material of the embedded components, is reduced by processing the embedding stack material (for example a polymer matrix) to reach the metallic surface of the component and to add a material, i.e. the stabilizing structure, which has a highest stress absorption and highest interface adhesion to e.g. an area, in particular a metallic area, of the component. Furthermore, laminar stress flow over an interface polymer (of the stack) to a component structure like wafer material, e.g. glass, in particular silicium, may be also reduced by processing the embedding stack material (for example a polymer matrix) to reach the surface of the component.

The stabilization structure may also be a blind Cu via adhering to the glass/silicium surface of the component in order to solely act in its stabilization function without electrically connecting the component. Thus, for realizing the stabilizing and delamination minimization characteristic, connecting the stabilizing structure to a Cu pad on the component may be possible but not necessary as a connection to any surface of a wafer material (such as glass/silicium) may be also possible.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imagable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered trademark of The Chemours Company FC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high-frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular materials coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the present component carrier are apparent from the examples of embodiment to be described hereinafter and are explained with reference to the examples of embodiment. The component carrier will be described in more detail hereinafter with reference to examples of embodiment but to which the component carrier is not limited.

DETAILED DESCRIPTION OF ILLUSTRATED EMBODIMENTS

Figure 1:
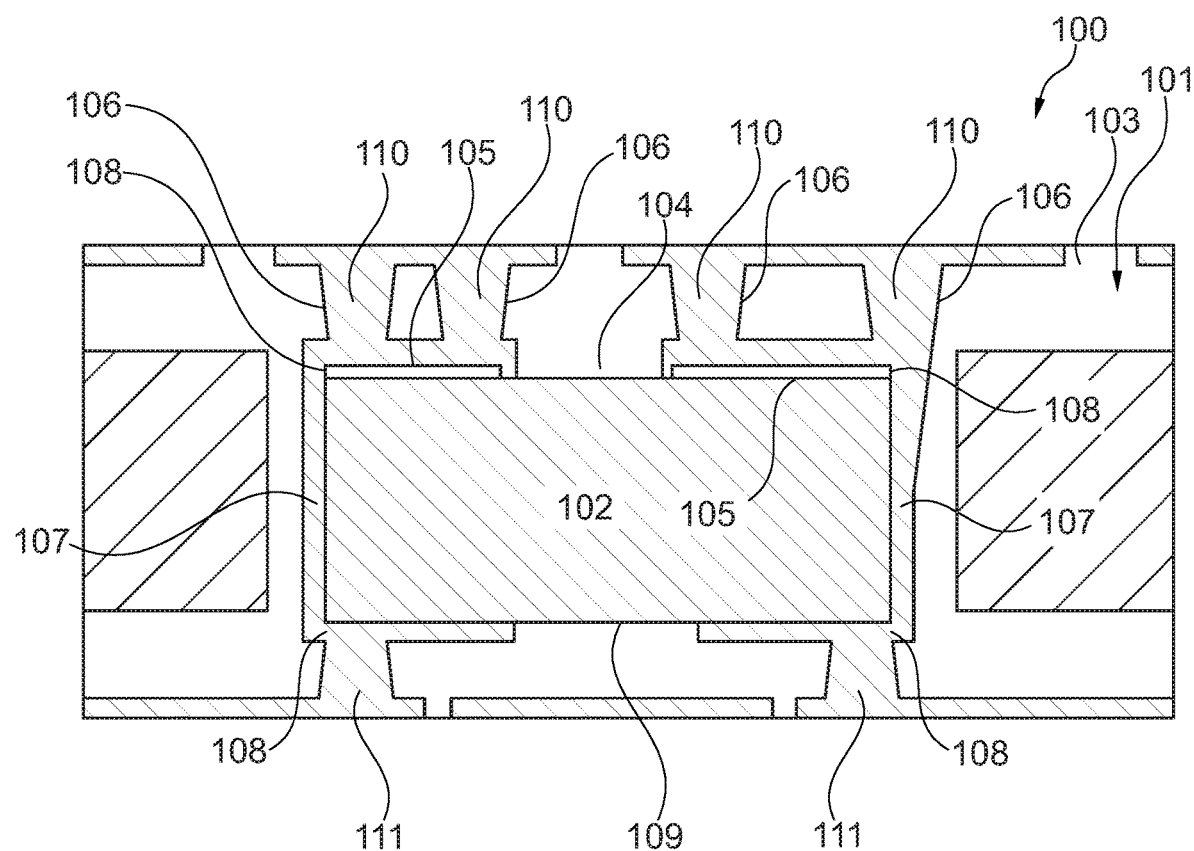
FIG. 1 shows a cross-sectional view of an embodiment of a component carrier.

The illustration in the drawings is schematically presented. It is noted that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment are not elucidated again at a later position of the description.

Further, spatially relative terms, such as "front" and "back", "above" and "below", "left" and "right", et cetera are used to describe an element's relationship to another element(s) as illustrated in the figures. Thus, the spatially relative terms may apply to orientations in use which differ from the orientation depicted in the figures. Obviously, all such spatially relative terms refer to the orientation shown in the figures only for ease of description and are not necessarily limiting as an apparatus according to an embodiment of the component carrier can assume orientations different than those illustrated in the figures when in use.

Figure 2:
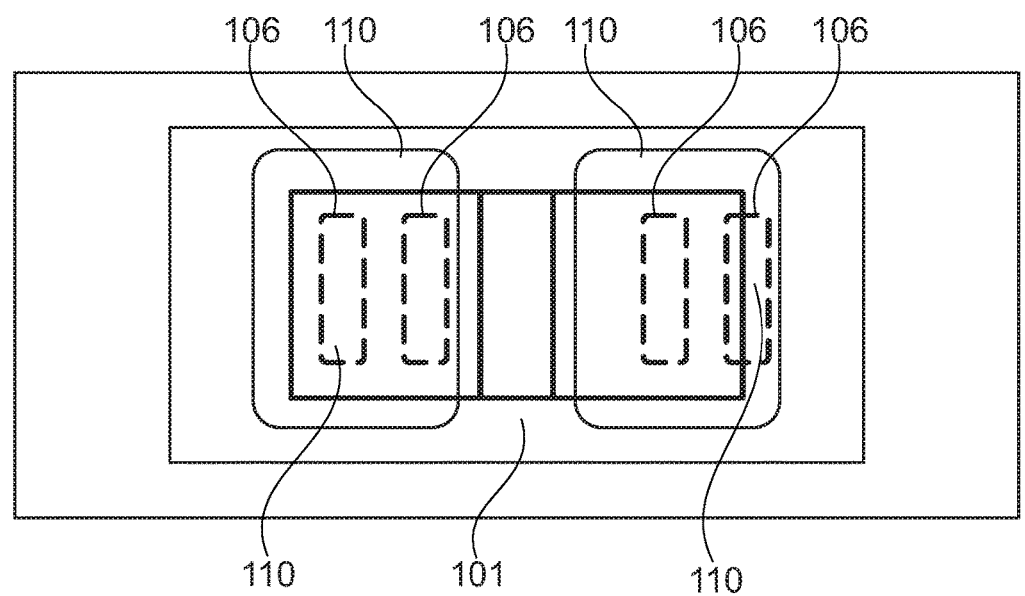
FIG. 2 shows a top view of the component carrier shown in FIG. 1.

FIG. 1 and FIG. 2 show a component carrier 100 with a stack 101 comprising at least one electrically insulating layer structure and/or at least one electrically conductive layer structure. The component carrier 100 further comprises a component 102 which is embedded in the stack 101. Additionally, the component carrier 100 further comprises a stabilizing structure 110 arranged between an outer stack surface 103 of the stack 101 and a main surface 104 of the component 102, wherein the stabilizing structure 110 is configured for providing an interface adhesion to the main surface 104 of the component 102.

The component carrier 100 is configured as a mechanical and/or electronic carrier for components 102. The component carrier comprises a stack 101 of at least one electrically insulating layer structure and at least one electrically conductive layer structure. For example, the component carrier 100 is a laminate of the mentioned electrically insulating layer structure(s) and electrically conductive layer structure(s), in particular formed by applying mechanical pressure and/or thermal energy.

The component 102 is in particular an electric component having electrical connections to other components within the stack 101 or to other functional elements within or outside the stack 101. The component 102 comprises two opposing main surfaces 104, 109 to which electrical connections for transmitting signals or power to and away of the component 102 can be coupled. The main surfaces 104, 109 are connected by the lateral side surfaces 107 of the stack 101. Between main surface 104, 109 and the respective side surface 107, an edge 108 is formed.

The stabilizing structure 110 is arranged within the stack 101 and in particular between the stack surface 103 of the stack 101 and the main surface 104 of the component 102. The stabilizing structure 110 provides an interface adhesion to the main surface 104 of the component 102 in order to reduce the risk of delamination. In particular, the stabilizing structure 110 is chosen of a material which may comprise an improved adhesion to the component 102 in comparison to the stack 101 and the several stacked layers, respectively. In particular, the stabilizing structure 110 is made of material which has the highest stress absorption and the highest interface/interface adhesion to a metallic area 105 of the component 102. Hence, according to the present embodiment a more robust component carrier is provided due to the reduction of the risk of delamination by the stabilizing structure.

The metallic area 105 of the component 102 may for example be a casing or an electrical contact of the component 102. However, the material of the stack 101 may be for example ceramic or a polymer (such as prepreg, resin coated copper foils or resin sheets) which has low-adhesion characteristics to the metallic area 105 of the component 102. However, in the region of the metallic area 105 of the component 102, the stabilizing structure 110 is formed, such that an increased adhesion between the stabilizing structure 110 and the metallic area 105 can be provided.

The stack 101 comprises a plurality of openings 106 between the stack surface 103 and the main surface 104 of the component 102 filled with the stabilizing structure 110.

The component carrier 100 further comprises at least one via 111 which is formed within the stack 101. The via 111 is coupled to the component 102 and provides an electrical connection to the component 102. The material of the via 111 may differ from the material of the stabilizing structure 110. The via 111 transfers signals or power to or away from the component 102. Additionally, the stabilizing structure 110 may be attached to the vias 111. Hence, the vias 111 can be designed without having high-lamination characteristics because the task can be fulfilled by the additional stabilizing structure 110. Hence, the material of the vias 111 differs from the material of the stabilizing structure 110.

The stabilizing structure 110 provides an interface adhesion to the main surface 104, the further main surface 109 and the side surface 107 of the component 102. Hence, the stabilizing structure 110 partially envelopes the component 102 for increasing the lamination properties. Hence, in other words, the stabilizing structure 110 extends along the main surface 104, 109 and additionally along the side surface 107. Thereby, the stabilizing structure 110 envelopes the edge 108 of the component 102. Hence, the sharp edges 108 of the component are covered by the stabilizing structure 110, so that the risk of delamination in the edge area is reduced.

The stabilizing structure 110 extends along the side surface 107 of the component 102, wherein the stabilizing structure 110 comprises at the edge 108 of the component 102 a larger thickness than at a central area of the side surface 107 being spaced apart from the edge 108. Hence, at the edges 108 of the component, a high mechanical strength due to the thicker stabilizing structure at the edge section can be provided.

The stabilizing structure 110 forms stabilizing pillars. The pillars may be made of a cylindrical shape having a rectangular base area as can be observed from FIG. 2. The pillar forms an extension between the main surface 104 of the component 102 and the surface (outer surface) 103 of the stack 101. The stabilizing pillar comprises a wedge shape having a larger thickness in a section at the stack surface 103 than at the main surface 104.

It should be noted that the term "comprising" does not exclude other elements or steps and the article "a" or "an" does not exclude a plurality. Also, elements described in association with different embodiments may be combined.

Implementation of the component carrier is not limited to the preferred embodiments shown in the figures and described above. Instead, a multiplicity of variants are possible which use the solutions shown and the principle according to the disclosed component carrier even in the case of fundamentally different embodiments.

REFERENCE NUMERALS 100 component carrier
101 stack
102 component
103 stack surface
104 main surface
105 metallic area
106 opening
107 side surface
108 edge
109 further main surface
110 stabilizing structure
111 via

The invention claimed is:

1. A component carrier, comprising:
   a stack having at least one electrically insulating layer structure and/or at least one electrically conductive layer structure;
   a component which is embedded in the stack; and
   a stabilizing structure arranged between a stack surface of the stack and a main surface of the component,
   wherein the stabilizing structure is configured for providing an interface adhesion to the main surface of the component,
   wherein the stack comprises at least one opening between the stack surface and the main surface of the component filled with the stabilizing structure.

2. The component carrier according to claim 1,
   wherein the main surface of the component comprises a metallic area.

3. The component carrier according to claim 1, wherein the stabilizing structure comprises at least one of copper material, silver paste material and tin paste material.

4. The component carrier according to claim 1, wherein the component carrier further comprises:
   a via which is formed within the stack, wherein the via is coupled to the component and provides an electrical connection to the component,
   wherein the material of the via differs from the material of the stabilizing structure.

5. The component carrier according to claim 1,
   wherein the component comprises a side surface and an edge between the main surface and the side surface.

6. The component carrier according to claim 5,
wherein the side surface is free of an interface adhesion with the stabilizing structure.

7. The component carrier according to claim 5,
wherein the stabilizing structure provides an interface adhesion to the main surface of the component and to the side surface of the component.

8. The component carrier according to claim 5,
wherein the component comprises a further main surface being arranged opposed to the main surface,
wherein the stabilizing structure provides an interface adhesion to the main surface, the further main surface and the side surface of the component.

9. The component carrier according to claim 5,
wherein the stabilizing structure extends along the side surface of the component,
wherein the stabilizing structure comprises at the edge of the component a larger thickness than a relatively smaller thickness at a central area of the side surface being spaced apart from the edge.

10. The component carrier according to claim 1,
wherein the stabilizing structure forms a stabilizing pillar.

11. The component carrier according to claim 10,
wherein the stabilizing pillar comprises a wedge shape having a larger thickness in a section at the stack surface than a relatively smaller thickness at the main surface.

12. The component carrier according to claim 1, wherein the component carrier comprises at least one of the following features:
wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein at least one of the electrically conductive layer structures of the component carrier comprises at least one of a group consisting of copper, aluminum, nickel, silver, gold, palladium, and tungsten, any of the mentioned materials being coated with supra-conductive material;
wherein the electrically insulating layer structure comprises at least one of a group consisting of resin, cyanate ester, polyphenylene derivate, glass, prepreg material, polyimide, polyamide, liquid crystal polymer, epoxy-based build-up material, polytetrafluoroethylene, a ceramic, and a metal oxide;
wherein the component carrier is shaped as a plate;
wherein the component carrier is configured as one of a group consisting of a printed circuit board, a substrate, and an interposer;
wherein the component carrier is configured as a laminate-type component carrier.

13. The component carrier according to claim 12, wherein the supra-conductive material is graphene.

14. The component carrier according to claim 12, wherein the resin is reinforced or non-reinforced resin.

15. The component carrier according to claim 12, wherein the resin is epoxy resin or bismaleimide-triazine resin, FR-4, FR-5.

* * * * *